US007004766B2

(12) United States Patent
Chen et al.

(10) Patent No.: US 7,004,766 B2
(45) Date of Patent: Feb. 28, 2006

(54) TINE PLATE

(75) Inventors: Ping Chen, West Bloomfield, MI (US);
Sunao Mizuno, Novi, MI (US)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 10/955,723

(22) Filed: Sep. 29, 2004

(65) Prior Publication Data

US 2005/0095882 A1    May 5, 2005

(30) Foreign Application Priority Data

Oct. 31, 2003    (JP)    ............... 2003-373819

(51) Int. Cl.
*H01R 12/00*    (2006.01)
(52) U.S. Cl. ...................... 439/79; 439/701
(58) Field of Classification Search ................ 439/79, 439/80, 570, 567, 701
See application file for complete search history.

(56) References Cited

U.S. PATENT DOCUMENTS

| 5,688,129 | A |   | 11/1997 | Flaherty |         |
|-----------|---|---|---------|----------|---------|
| 5,827,076 | A | * | 10/1998 | Chen     | 439/79  |
| 6,062,877 | A | * | 5/2000  | Makino et al. | 439/79 |
| 6,171,116 | B1 | * | 1/2001 | Wicks et al. | 439/79 |
| 6,319,023 | B1 |   | 11/2001 | Goto et al. |         |
| 6,551,116 | B1 | * | 4/2003  | Liu      | 439/79  |
| 2003/0166348 | A1 | * | 9/2003 | Martin et al. | 439/79 |
| 2003/0176086 | A1 | * | 9/2003 | Ogawa    | 439/79  |
| 2005/0095883 | A1 |   | 5/2005 | Osada    |         |

FOREIGN PATENT DOCUMENTS

| JP | 5-048273 | 6/1993 |
| JP | 09035829 | 2/1997 |
| JP | 10154537 | 6/1998 |
| JP | 11-135204 | 5/1999 |
| WO | WO98/24156 | 6/1998 |

OTHER PUBLICATIONS

JST Corporation, redacted copy of Drawing No. CD1-00115-100 R5, of AIT Connector 34P M-ASSY, dated Jun. 4, 2003.

"Confidential Information and Non-Disclosure Agreement" dated Apr. 25, 2003 between J.S.T. Corporation and DENSO International America, Inc.

* cited by examiner

*Primary Examiner*—Hien Vu
(74) *Attorney, Agent, or Firm*—W. F. Fasse; W. G. Fasse

(57) ABSTRACT

A tine plate is to cooperate with parallel-extending contact legs of an electric connector. The tine plate has a plurality of through holes, which penetrate through the thickness of the tine plate and into which the contact legs are to be inserted. At least those through holes on both ends of the tine plate in the longitudinal direction respectively have an elongated hole shape of which the largest value of the inside dimension thereof in the longitudinal direction of the tine plate is greater than the largest value of the inside dimension in the transverse direction of the tine plate.

10 Claims, 3 Drawing Sheets

TINE PLATE

BACKGROUND OF THE INVENTION

1. Field of the Invention

The present invention belongs to the field of tine plate, which is mounted on an electric connector to line up the legs of contacts.

2. Related Art

Japanese Patent Unexamined Publication Heisei 9-35829 discloses a tine plate for an electric connector. The electric connector comprises a plurality of contacts, each of which has a tine part that is to be inserted into a through hole of a board and a contacting part that is to contact a contact of a mutually-engaging counterpart connector. The electric connector further comprises a housing in which the plurality of contacts are arranged. The tine plate has therein a plurality of through holes, through which the tine parts of the plurality of contacts are respectively to be inserted, and which is arranged in a lining-up position to line up the tine parts by making the respective tine parts penetrate through the plurality of through holes. The tine plate is characterized in that it further has a slot, which interconnects at least two or more through holes of the plurality of through holes.

Japanese Patent Unexamined Publication Heisei 10-154537 discloses a board mount type connector, and this connector is provided with a tine plate. This tine plate has three rows of through holes that correspond to the number of contacts. Some through holes of a row of through holes, which is the closest to the housing among these rows of through holes, are interconnected with each other by slots. With this arrangement, even when there is a difference in coefficient of thermal expansion between a board and the tine plate, stresses that are generated in the soldering parts of the legs are moderated, hence solder cracking does not take place (refer to paragraph 0012 of the publication).

When such a tine plate is mounted on an electric connector, the legs of a plurality of contacts, which substantially extend in parallel to each other, will be neatly lined up by the tine plate, hence when these legs are to be inserted into the insertion holes of a printed circuit board so as to mount the electric connector on the printed circuit board, the workability of this mounting can be enhanced. Moreover, the tine plate can cover and protect the legs of the contacts.

When there is a difference in thermal expansion quantity between a tine plate and a printed circuit board due to a difference in coefficient of thermal expansion, etc. between them, it will pose such a trouble that, due to variations in the service ambient temperature, the tine plate and the legs of the contacts that are soldered onto the printed circuit board interfere with each other, resulting in generation of cracks in the soldering parts of the legs. The inventions of the above-mentioned Japanese Patent Unexamined Publication Heisei 9-35829 and Japanese Patent Unexamined Publication Heisei 10-154537 prevent this trouble by providing the tine plate with slots that interconnect through holes.

SUMMARY OF THE INVENTION

However, if a tine plate is thus provided with slots that interconnect through holes, because slits are formed in the tine plate by the through holes and the slots, the strength of the tine plate will be decreased. Moreover, when the tine plate is formed by injection molding or the like, the flow of a molten material will be hindered by molds, pins or the like for forming the slots, thus it poses a problem of decrease in the yield of the tine plate.

The present invention was made in view of these points, and its object is to provide a tine plate wherein the independency of the through holes into which the legs of the contacts are to be inserted is secured to improve the strength of the tine plate and enhance its moldability and in turn improve its yield while it can reliably prevent the trouble that, due to variations in the service ambient temperature, the tine plate and the legs of the contacts interfere with each other, resulting in generation of cracks in the soldering parts of the legs.

To accomplish the above-mentioned object, the tine plate according to the present invention is a tine plate that is to be mounted on an electric connector, which comprises a plurality of contacts, each of which is provided on one end with a leg that is to be inserted into an insertion hole that penetrates a printed circuit board in the thickness direction thereof and on the other end side of the leg with a contacting part that is to contact a contact of a counterpart connector, and an insulative housing in which these contacts are so provided that their legs substantially extend in parallel to each other. This tine plate has a longitudinal direction in which the distance between the edges of the tine plate when seen in the thickness direction is the largest, and a transverse direction that is perpendicular to the longitudinal direction, and this tine plate is provided with a plurality of through holes, which penetrate the tine plate in the thickness direction thereof and into which the legs of the contacts are to be inserted, and as to at least through holes on both ends substantially in the longitudinal direction of the tine plate, the largest value of the inside dimension in the longitudinal direction of the tine plate when seen in the thickness direction is made greater than the largest value of the inside dimension in the transverse direction of the tine plate.

When this tine plate is mounted on an electric connector, the legs of the plurality of contacts, which substantially extend in parallel to each other, will be neatly lined up by the tine plate, hence when these legs are to be inserted into the insertion holes of the printed circuit board to mount the electric connector on the printed circuit board, the workability of the mounting can be enhanced. Moreover, the tine plate can cover and in turn protect the legs of the contacts.

When there is a difference in thermal expansion quantity between the tine plate and the printed circuit board due to a difference in coefficient of thermal expansion, etc. between them, the closer is a given portion of the tine plate to any of both ends in the substantially longitudinal direction of the tine plate, the greater is the difference in thermal expansion quantity between them. In response to this fact, in this tine plate, at least through holes on both the ends in the substantially longitudinal direction of the tine plate are so arranged that the largest value of the inside dimension in the longitudinal direction of the tine plate when seen in the thickness direction is made greater than the largest value of the inside dimension in the transverse direction of the tine plate. As a result, even if there are variations in the service ambient temperature, the tine plate and the legs of the contacts that are soldered onto the printed circuit board are restrained or prevented from interfering with each other, thus the trouble of generating cracks in the soldering parts of the legs is avoided. In that case, in comparison with the conventional cases wherein a tine plate is provided with slots that interconnect through holes, the independency of the respective through holes is secured, hence the strength of the tine plate is enhanced, and moreover, when the tine plate is to be formed by injection molding or the like, the flow of a molten material is hardly held back, thus the yield of the tine plate is improved.

Accordingly, with the tine plate according to the present invention, the inventors have successfully provided a tine plate wherein the independency of the through holes into which the legs of the contacts are to be inserted is secured to improve the strength of the tine plate and enhance its moldability and in turn improve its yield while it can reliably prevent the trouble that, due to variations in the service ambient temperature, the tine plate and the legs of the contacts interfere with each other, resulting in generation of cracks in the soldering parts of the legs.

The tine plate of the present invention may be so arranged that the through holes are, when seen in the thickness direction, distorted circles that are circles elongated in the longitudinal direction of the tine plate, or ellipses of which major axes extend in the longitudinal direction of the tine plate.

With this description, the configurations of the through holes of the present invention have been exemplified.

PREFERRED EMBODIMENT OF THE INVENTION

Figure 1:
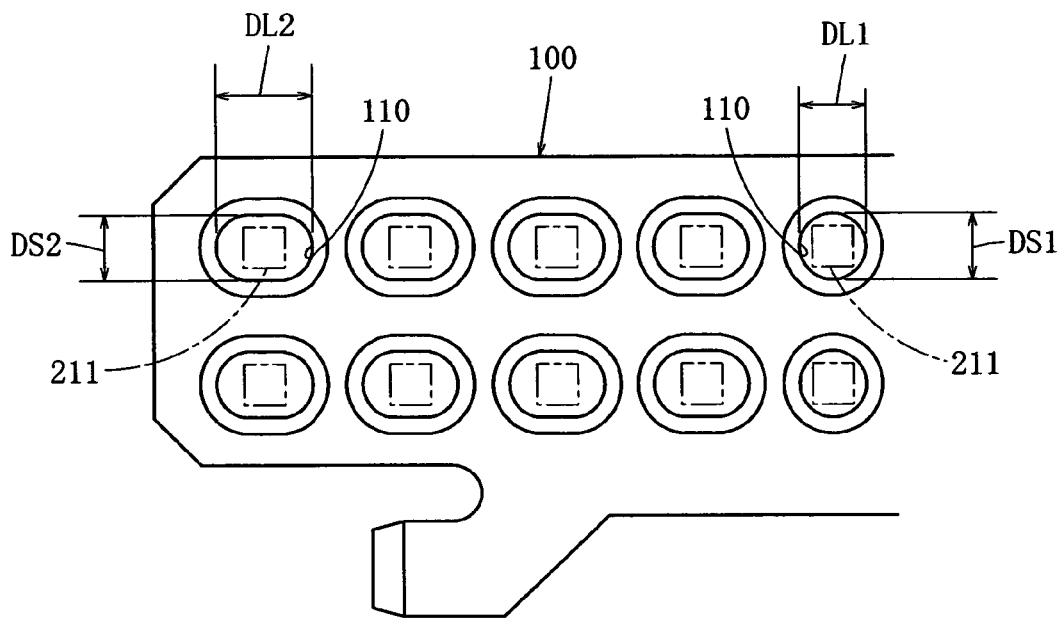
FIG. 1 is an enlarged plan view of one end in the longitudinal direction of the tine plate of the first embodiment seen in the height direction.
Figure 2:
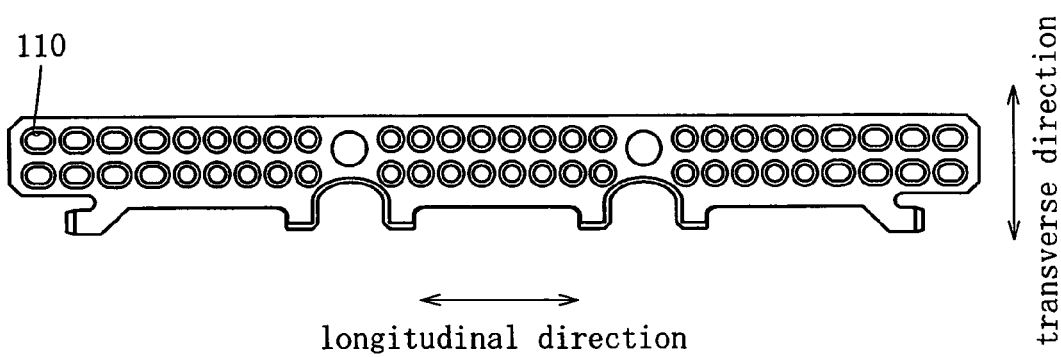
FIG. 2 is a plan view of the tine plate of the first embodiment seen in the height direction.
Figure 3:
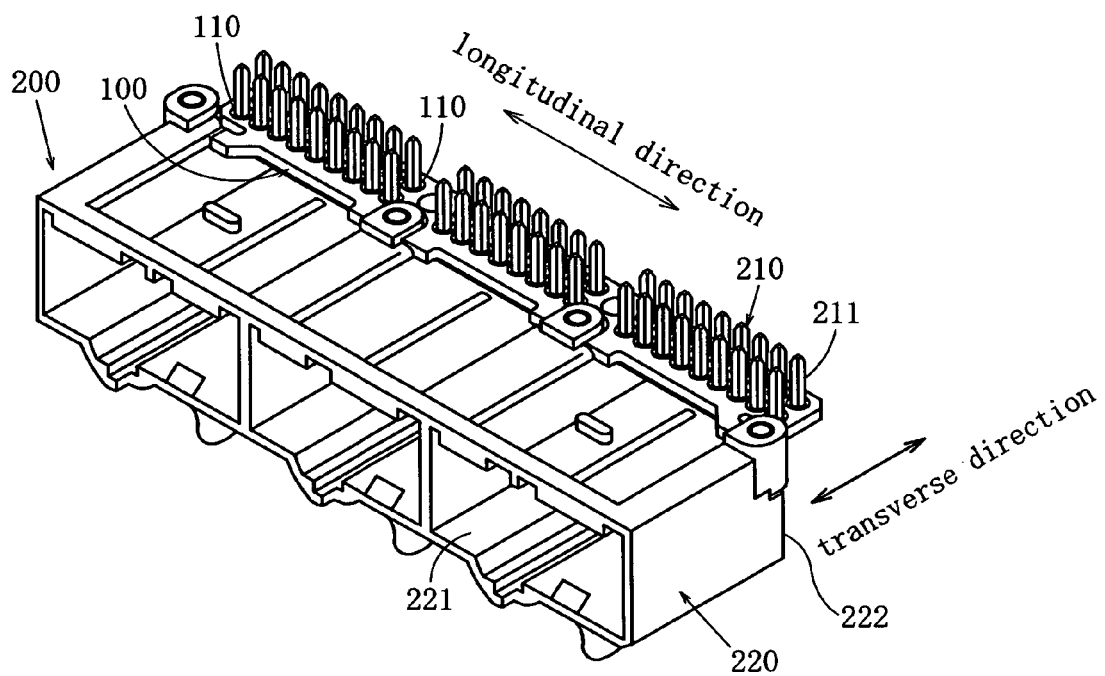
FIG. 3 is a perspective view showing an electric connector on which the tine plate of the first embodiment is mounted.
Figure 4:
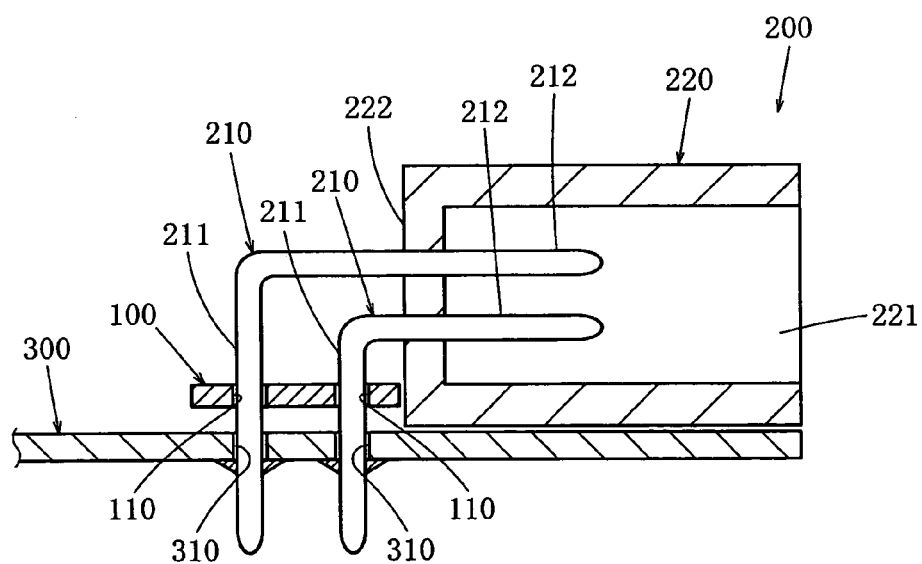
FIG. 4 is a sectional view of the electric connector on which the tine plate of the first embodiment is mounted, and the electric connector is mounted on a printed circuit board and sectioned in a plane facing in the width direction and seen in the width direction.

In the following, some embodiments of the present invention will be described. FIG. 1 and FIG. 2 show a tine plate 100 being the first embodiment of the present invention. This tine plate 100 is to be mounted on an electric connector 200 that is shown in FIG. 3 and FIG. 4. This electric connector 200 comprises a plurality of contacts 210 that are made of a conductive material and an insulative housing 220 that is made of an insulative material and holds the contacts 210. The contact 210 is provided, at one end, with a leg 211 that is to be inserted into an insertion hole 310, which is made to penetrate through a printed circuit board 300 in the thickness direction thereof, and on the other end side of this leg 211, with a contacting part 212 that is to contact a contact of a counterpart connector (not illustrated). These contacts 210 are provided in the insulative housing 220 in such a way that the legs 211 extend substantially in parallel to each other. A relatively large number of the legs 211 of the contacts 210 are lined up in a direction that is contained in a plane that is substantially perpendicular to the extending direction of the legs 211, and a relatively small number of the legs 211 of the contacts 210 are lined up in a direction that is contained in the plane and is substantially perpendicular to the direction. The former direction is referred to as the longitudinal direction of the group of the contact legs, and the latter direction is referred to as the transverse direction of the group of the contact legs. The cross sectional configuration of the legs 211 of the contacts 210 is the same, and when the leg 211 of the contact 210 is sectioned in a plane that is perpendicular to the extending direction of the leg 211, the dimension of this section in the longitudinal direction of the group of the contact legs and the dimension of this section in the transverse direction are substantially equal to each other. When the electric connector 200 is to be mounted on a printed circuit board 300, it does not matter whether the insulative housing 220 is fixed on the printed circuit board 300 or not.

A depth direction, a width direction and a height direction all being perpendicular to each other are assumed, and these directions are used in the following description. In the case of this embodiment, with reference to FIG. 4, the left-right direction of the diagram is the depth direction, the left of the diagram is the rear in the depth direction, and the right is the front in the depth direction. The direction perpendicular to the plane of the paper is the width direction, and the top-bottom direction of the diagram is the height direction. In the case of this embodiment, the insulative housing 220 is provided with receiving chambers 221 that open to the front in the depth direction, and the receiving chambers 221 are arranged to receive the counterpart connectors. The contact 210 is bent into an L-shape, one end of the contact 210 extends in the height direction to constitute the leg 211, and this leg 211 is arranged to be inserted into an insertion hole 310 of the printed circuit board. The other end of the contact 210 extends in the depth direction to penetrate and get fixed in a rear wall 222 that is provided on the rear side of the receiving chamber 221 of the insulative housing 220, and the top end is located inside the receiving chamber 221 to constitute the contacting part 212. The legs 211 of the contacts 210 are lined up in two rows in the depth direction, and twenty-six (26) legs 211 are lined up in the width direction in each row. The contacting parts 212 of the contacts 210 are lined up in two rows in the height direction, and twenty-six (26) contacting parts 212 are lined up in the width direction in each row. Accordingly, in this embodiment, the width direction is the longitudinal direction of the group of contact legs, and the depth direction is the transverse direction of the group of contact legs. The electric connector 200 has been described in detail above, however, the number, direction, arrangement, etc. of the contacts of the electric connector according to the present invention are not limited in any way by this embodiment, and the configuration, direction, etc. of the insulative housing are not limited in any way by this embodiment.

The tine plate 100 is made of an insulative material and is formed into a plate shape of which thickness direction is the extending direction of the legs 211 of the contacts 210. Hence here the height direction is the thickness direction. This tine plate 100 has the longitudinal direction, in which the distance between both edges when seen in the thickness direction is the largest, and the transverse direction that is perpendicular to the longitudinal direction. In other words, according to the layout of the group of the contact legs, the longitudinal direction of the group of the contact legs becomes the longitudinal direction of the tine plate 100, and the transverse direction of the group of the contact legs becomes the transverse direction of the tine plate 100. Accordingly, in this embodiment, the width direction becomes the longitudinal direction of the tine plate 100, and the depth direction becomes the transverse direction of the tine plate 100. This tine plate 100 is provided with a plurality of through holes 110, which penetrate through the tine plate 100 in the thickness direction and into which the legs 211 of the contacts 210 are to be inserted.

Of the through holes 110, at least through holes 110 that are located at both ends in the substantially longitudinal direction of the tine plate 100 are hereby referred to as the outer through holes 110, and the through holes 110 except the outer through holes 110 are referred to as the inner through holes 110. The outer through holes 110 may be only through holes 110 that are on both ends in the substantially longitudinal direction of the tine plate, or may include in addition to them, some through holes 110 that are inwardly consecutive to the through holes 110 being located at both ends. The inner through holes are, for example, through holes 110 that are located around the center in the substantially longitudinal direction of the tine plate 100. As for the inner through holes 110, the largest value DL1 of the inside dimension in the longitudinal direction of the tine plate 100 when seen in the thickness direction and the largest value DS1 of the inside dimension in the transverse direction of the tine plate 100 are substantially of the same dimension. In contrast to this, as for the outer through holes 110, the largest value DL2 of the inside dimension in the longitudinal direction of the tine plate 100 when seen in the thickness direction is made larger than the largest value DS2 of the inside dimension in the transverse direction of the tine plate 100. In this case, the largest value DS1 of the inside dimension in the transverse direction of the tine plate 100 of the inner through holes 110 and the largest value DS2 of the inside dimension in the transverse direction of the tine plate 100 of the outer through holes 110 are substantially of the same dimension. Here the inside dimension is the dimension between the inner walls of the through hole.

In the case of this embodiment, the through holes 110 are, when seen in the thickness direction, distorted circles that are circles elongated in the longitudinal direction of the tine plate 100. This distorted circle is such a configuration that a perfect circle is halved in the longitudinal direction into two hemicircles and the ends of these two hemicircles are connected by a line segment. It does not matter whether the opening of the through hole is chamfered or not.

Accordingly, when this tine plate 100 is mounted on the electric connector 200, the legs 211 of the plurality of contacts 210, which extend substantially in parallel to each other, will be neatly lined up by the tine plate 100, hence when the electric connector 200 is to be mounted on a printed circuit board 300 by inserting these legs 211 into the insertion holes 310 of the printed circuit board 300, the workability of the mounting can be enhanced. Moreover, the tine plate 100 can cover and protect the legs 211 of the contacts 210.

When there is a difference in thermal expansion quantity between the tine plate 100 and the printed circuit board 300 due to a difference in coefficient of thermal expansion, etc. between them, the closer is a given portion of the tine plate to any of both ends in the substantially longitudinal direction of the tine plate 100, the greater is the difference in thermal expansion quantity between them. In response to this fact, in this tine plate 100, at least through holes 110 on both the ends in the substantially longitudinal direction of the tine plate 100 are so arranged that the largest value of the inside dimension in the longitudinal direction of the tine plate 100 when seen in the thickness direction is made greater than the largest value of the inside dimension in the transverse direction of the tine plate 100. As a result, even if there are variations in the service ambient temperature, the tine plate 100 and the legs 211 of the contacts 210 that are soldered onto the printed circuit board 300 are restrained or prevented from interfering with each other, thus the trouble of generating cracks in the soldering parts of the legs 211 is avoided. In that case, in comparison with the conventional cases wherein a tine plate is provided with slots that interconnect through holes, the independency of the respective through holes 110 is secured, hence the strength of the tine plate 100 is enhanced, and moreover, when the tine plate 100 is to be formed by injection molding or the like, the flow of a molten material is hardly held back, thus the yield of the tine plate 100 is improved.

Figure 5:
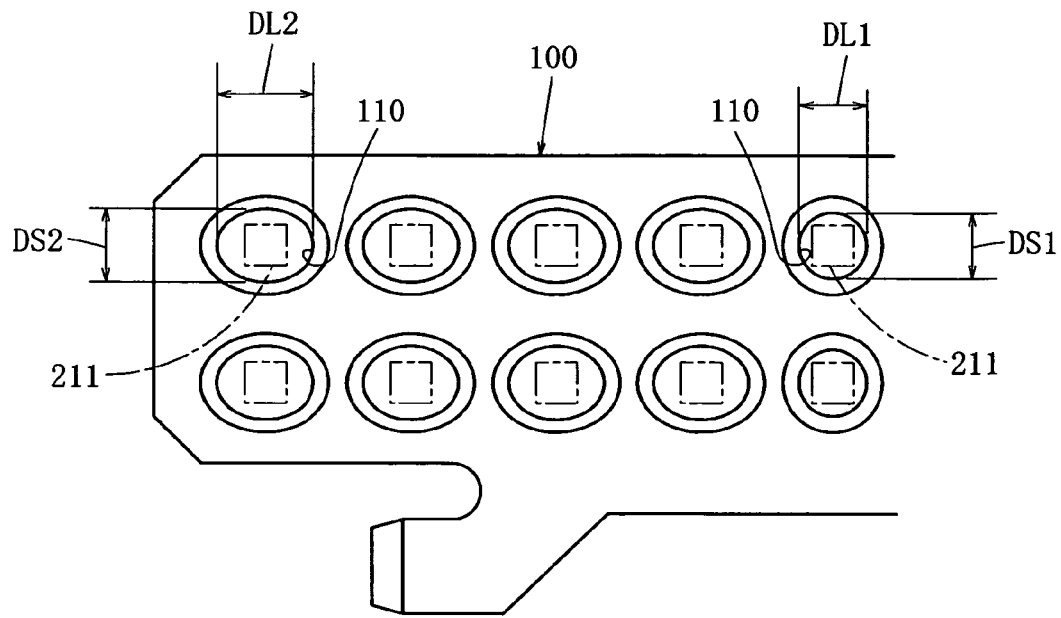
FIG. 5 is an enlarged plan view of one end in the longitudinal direction of the tine plate of the second embodiment seen in the height direction.

FIG. 5 shows the tine plate 100 of the second embodiment. As for the tine plate 100 of the first embodiment, the through holes 110 are, when seen in the thickness direction, distorted circles that are circles elongated in the longitudinal direction of the tine plate 100, whereas as for the tine plate 100 of the second embodiment, the through holes 110 are, when seen in the thickness direction, ellipses of which major axes extend in the longitudinal direction of the tine plate 100. Other structures are similar to those of the tine plate 100 of the first embodiment, and the functions and effects are also similar.

Figure 6:
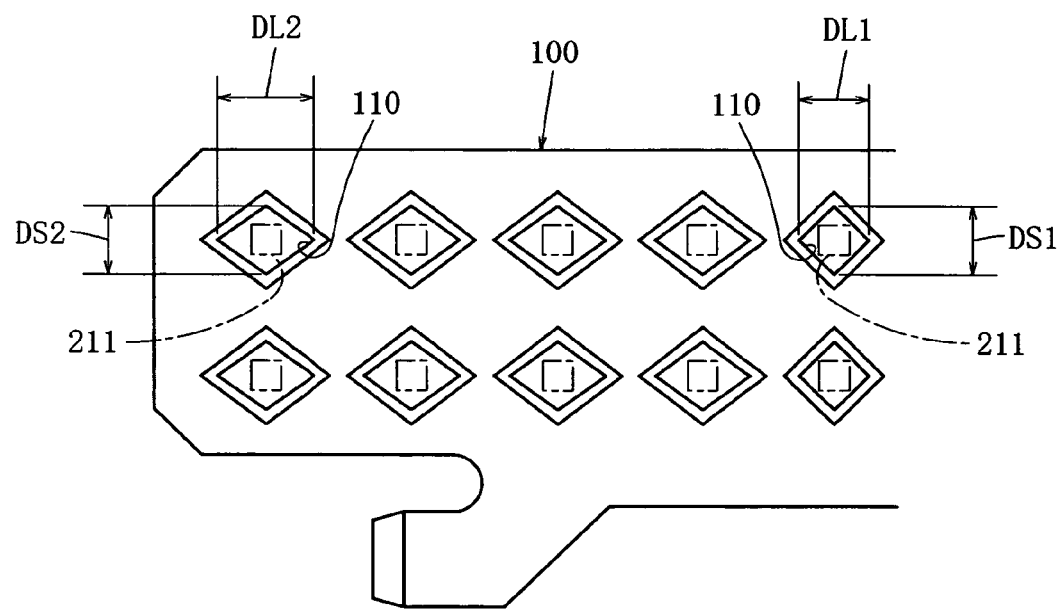
FIG. 6 is an enlarged plan view of one end in the longitudinal direction of the tine plate of the third embodiment seen in the height direction.

FIG. 6 shows the tine plate 100 of the third embodiment. As for the tine plate 100 of the third embodiment, the configuration of the through holes 110 differs from that of the tine plate 100 of the first embodiment. In the tine plate 100 of the third embodiment, the through holes 110 are, when seen in the thickness direction, rhombuses wherein the longer diagonal extends in the longitudinal direction of the tine plate 100 and the shorter diagonal extends in the transverse direction thereof. Other structures are similar to those of the tine plate 100 of the first embodiment, and the functions and effects are also similar.

The present invention includes embodiments wherein features of the above-mentioned embodiments are combined.

What is claimed is:

1. A tine plate that is to be mounted on an electric connector, wherein the electric connector comprises a plurality of contacts, each of which includes at one end a contact leg that is to be inserted into an insertion hole that penetrates through a thickness of a printed circuit board and includes at an other end a contacting part that is to contact a contact of a counterpart connector, and the electric connector further comprises an insulative housing in which the contacts are arranged so that the contact legs thereof extend substantially parallel to each other, said tine plate comprising:

a plate of insulating material that has a longitudinal direction in which a largest dimension thereof extends, and a transverse direction perpendicular to the longitudinal direction, wherein the tine plate has a plurality of through holes, which holes penetrate through a thickness of the tine plate and into which holes the contact legs of the contacts are to be inserted, and wherein at least some of the through holes at respective ends of the tine plate in the longitudinal direction respectively have an elongated hole shape of which a largest value of an inside dimension thereof in the longitudinal direction of the tine plate is greater than a largest value of an inside dimension thereof in the transverse direction of the tine plate, wherein the elongated hole shape is a distorted circle shape that is elongated in the longitudinal direction of the tine plate, or an ellipse having a major axis extending in the longitudinal direction of the tine plate, and wherein the through holes are all respectively independent individual holes that are not interconnected with one another and that are configured and arranged so that each one of the holes receives no more than one of the contact legs therein.

2. A tine plate that is to be mounted on an electric connector, wherein the electric connector includes a plurality of contact legs protruding from an insulative housing, said tine plate comprising:

a plate of insulating material that has an elongated plate shape with a longest dimension thereof extending in a longitudinal direction, the tine plate has plural holes that penetrate through a thickness of the tine plate and that are configured and arranged to have the contact legs of the electric connector respectively inserted therethrough so as to position and support the contact legs with the tine plate, the plural holes include first holes that each respectively have an elongated hole shape that is longer in the longitudinal direction than in a transverse direction perpendicular thereto, the plural holes further include second holes that each respectively has a hole shape that has equal dimensions respectively in the longitudinal direction and in the transverse direction, and the first holes are provided in end regions of the tine plate proximate to two opposite ends of the tine plate in the longitudinal direction, and the second holes are provided in a center region of the tine plate between the end regions.

3. The tine plate according to claim 2, wherein the hole shape of the second holes is a uniform circular shape.

4. The tine plate according to claim 2, wherein the hole shape of the second holes is a square shape.

5. The tine plate according to claim 4, wherein the square shape of the second holes is oriented obliquely relative to the longitudinal direction, with corner-to-corner diagonals of the square shape respectively extending parallel to the longitudinal direction and the transverse direction.

6. The tine plate according to claim 2, wherein the elongated hole shape of the first holes is an elongated oval shape.

7. The tine plate according to claim 2, wherein the elongated hole shape of the first holes is an elongated ellipse shape.

8. The tine plate according to claim 2, wherein the elongated hole shape of the first holes is an elongated rhombus shape.

9. The tine plate according to claim 2, wherein the plural holes are all respectively independent individual holes that are not interconnected with one another and that are configured and arranged so that each one of the holes receives no more than one of the contact legs therein.

10. A combination of the tine plate according to claim 2 together with the electric connector, wherein the tine plate is mounted on the electric connector and the contact legs respectively extend through the holes of the tine plate so as to be positioned and supported thereby.

* * * * *